US005606527A

United States Patent [19]

[11] Patent Number: 5,606,527

[45] Date of Patent: Feb. 25, 1997

Kwack et al.

[54] METHODS FOR DETECTING SHORT-CIRCUITED SIGNAL LINES IN NONVOLATILE SEMICONDUCTOR MEMORY AND CIRCUITRY THEREFOR

[75] Inventors: Jin-ho Kwack; Woung-Moo Lee, both of Seoul, Rep. of Korea

[73] Assignee: Samsung Electronics Co., Ltd., Kyungki-do, Rep. of Korea

[21] Appl. No.: 639,807

[22] Filed: Apr. 29, 1996

Related U.S. Application Data

[63] Continuation of Ser. No. 343,863, Nov. 17, 1994, abandoned.

[30] Foreign Application Priority Data

Nov. 17, 1993 [KR] Rep. of Korea .................. 24482/1993

[51] Int. Cl.[6] .................. G11C 7/00

[52] U.S. Cl. .................. 365/201; 365/185.17

[58] Field of Search .................. 365/185.17, 201, 365/230.03; 371/21.1

[56] References Cited

U.S. PATENT DOCUMENTS

| | | | |
|---|---|---|---|
| 3,712,537 | 1/1973 | Carita | 235/153 |
| 4,595,875 | 6/1986 | Chan | 324/73 PC |
| 4,625,162 | 11/1986 | Bosnyak | 324/51 |
| 4,670,708 | 6/1987 | Bosnyak | 324/51 |
| 4,841,482 | 6/1989 | Kreifels | 365/185 |
| 5,115,437 | 5/1992 | Welles | 371/22.5 |
| 5,117,426 | 5/1992 | McAdams | 371/214 |
| 5,119,378 | 3/1992 | Welles | 371/22.5 |
| 5,159,598 | 10/1992 | Welles | 371/22.1 |
| 5,293,348 | 3/1994 | Abe | 365/230.03 |
| 5,343,431 | 8/1994 | Ohtsuka | 365/201 |
| 5,363,382 | 11/1994 | Tsukakushi | 371/21.2 |
| 5,392,248 | 2/1995 | Truong | 365/201 |
| 5,400,279 | 3/1995 | Momodomi | 365/185 |

FOREIGN PATENT DOCUMENTS

| | | | |
|---|---|---|---|
| 4312238A1 | 10/1993 | Germany | G11C 29/00 |

*Primary Examiner*—Amir Zarabian
*Attorney, Agent, or Firm*—Allen LeRoy Limberg

[57] ABSTRACT

Alternative methods for detecting a short-circuit between signal lines in an electrically erasable and programmable nonvolatile semiconductor memory device use circuitry for detecting short-circuited signal lines. One method includes the steps of: floating first and second signal lines in response to another external input; simultaneously forming an electrical path between the first and second signal lines and each test pad; and determining whether a current path is formed between the test pads, for detecting any short-circuit between the first and second signal lines. Another method includes the steps of: floating the first and second signal lines in response to another external input; simultaneously forming the electrical path between the first signal line and the test pad while discharging the second signal line to the reference potential; and determining whether a current path is formed from the test pad to the reference potential, for detecting any short-circuit between the first and second signal lines.

21 Claims, 3 Drawing Sheets

METHODS FOR DETECTING SHORT-CIRCUITED SIGNAL LINES IN NONVOLATILE SEMICONDUCTOR MEMORY AND CIRCUITRY THEREFOR

This is a Continuation; of application Ser. No.: 08/343,863, filed on Nov. 17, 1994, which was abandoned upon the filing hereof.

FIELD OF THE INVENTION

The invention relates to electrically erasable and programmable nonvolatile semiconductor memory devices and, more particularly, to circuitry, for detecting short-circuited signal lines and to methods for detecting short-circuits between signal lines using such circuitry.

BACKGROUND OF THE INVENTION

Recently, electrically erasable and programmable nonvolatile semiconductor memory devices (hereinafter referred to as EEPROMs) have become more and more highly integrated, considerably complicating various circuits within the memory devices. Accordingly, a memory device with NAND structure cells which are suitable for high integration has been widely used. The memory device with NAND structure cells is typically constructed to comprise a memory cell array divided into a plurality of memory blocks each sharing one word line row decoder, which can select any one of the memory blocks in response to a block selection signal, thereby performing a predetermined operation. This EEPROM with NAND structure cells is disclosed in the Apr. 1991 *IEEE JOURNAL OF SOLID STATE CIRCUITS*, Vol. 26, No. 4, pp. 492–495.

Conventional EEPROMs include a redundancy cell array for repairing the defects produced during the manufacturing process. If a memory block cannot operate normally due to defects therein, it is replaced by a defect repairing memory block within the redundancy cell array. It is customary to test the operation of EEPROMs while still in a wafer state (i.e. at the completion of the manufacturing process before separating the individual EEPROMs) to detect and replace the defective memory block by a repairing memory block within the redundancy cell array. This defect repairing method becomes useful as the memory device becomes highly integrated. Particularly, it becomes more useful with the gradual decrease of a minimum feature size to submicron range, which increases the likelihood of defects being attributable to short-circuits between the signal lines—e.g., a short-circuit between adjacent word lines, or a short-circuit between a word line and a string selection line, or a short-circuit between a string selection line and a bit line. Short-circuits between signal lines can also occur where one signal line crosses over or under another.

In order to detect short-circuited signal lines of the types described in the previous paragraph, conventional EEPROMs program the corresponding memory block with common data and then read the data, comparing the read-out data to the corresponding initially programmed data to determine whether the memory block is defective. This procedure tends to take too long a test time. This is particularly so as the memory device becomes highly integrated., since defects caused by short-circuits between adjacent signal lines (e.g., adjacent word lines) tend to be more numerous. The test time can be reduced if it can be determined whether or not the memory block is defective without the procedure of erasing-programming-reading etc., but conventional EEPROMs are not constructed so as to make such a determination and accordingly need a long test time. Another problem arises in conventional EEPROMs in that, since these EEPROMs program the memory cell prior to reading and checking the programmed memory cell, if there is a problem in the programming process, the memory cell is repaired by the redundancy cell even when the memory cell is normal.

Accordingly, a method for more rapidly sensing a short-circuit between adjacent signal lines in an electrically erasable and programmable nonvolatile semiconductor memory device and circuitry for implementing the method were sought.

SUMMARY OF THE INVENTION

A method for detecting short-circuited signal lines in an electrically erasable and programmable nonvolatile semiconductor memory device, in accordance with an aspect of the invention, comprises the steps of floating first and second signal lines in response to a test command; responsive to the test command, forming an electrical path between the first signal line and a first test pad, and forming an electrical path between the second signal line and asecond test pad; and determining if a current path is formed between the first and second test pads, in order to detect any short-circuit between the first and second signal lines. An alternative method for detecting short-circuited signal lines in an electrically erasable and programmable nonvolatile semiconductor memory device, in accordance with an aspect of the invention, comprises the steps of floating first and second signal lines in response to a test command; responsive to the test command, forming an electrical path between the first signal line and a test pad, and discharging the second signal line to a reference potential; and determining if the current path is formed from the test pad to the reference potential, in order to detect any short-circuit between the first and second signal lines. Further aspects of the invention concern repetitions of each of the foregoing methods, changing the block selection signal for each repetition, to activate another memory block and then repeating the steps of floating and determining.

An electrically erasable and programmable nonvolatile semiconductor memory device embodying an aspect of the invention comprises first and second test pads; a block selection predecoder tier decoding a block selection address supplied from an external addressing source to supply a block selection signal; a word line row decoder for decoding a row address supplied from the external addressing source to supply a word line driving signal; and a plurality of memory blocks each composed of a predetermined number of NAND cell strings that receive the word line driving signal in common via shared word lines, one of which memory blocks is selectively activated by the block selection signal; and a circuit for detecting short-circuited signal lines by respectively floating first and second signal lines disposed in the memory block, connecting the first and second signal lines to the first and second test pads respectively, and checking whether there is a current path between the test pads, in order to detect any short-circuit between the first and second signal lines.

An electrically erasable and programmable nonvolatile semiconductor memory device embodying another aspect of the invention comprises a test pad; a block selection predecoder for decoding a block selection address supplied from an external addressing source to supply a block selection signal; a word line row decoder for decoding a row address supplied from the external addressing source to supply a word line driving signal; a plurality of memory blocks each composed of a predetermined number of NAND cell strings that receive the word line driving signal in common via shared word lines, one of which memory blocks is selectively activated by the block selection signal; and a circuit for detecting short-circuited signal lines by respectively floating the first and second signal lines disposed in the memory block, simultaneously connecting the first signal line to the test pad while discharging the second signal line to the reference potential, and checking whether a current path is formed from the test pad to the reference potential for detecting any short-circuit between the first and second signal lines.

BRIEF DESCRIPTION OF THE DRAWING

The above objects and other advantages of the present invention will become more apparent by describing the preferred embodiment of the present invention with reference to the attached drawings, in which.

DETAILED DESCRIPTION OF THE PREFERRED EMBODIMENT

Figure 1:
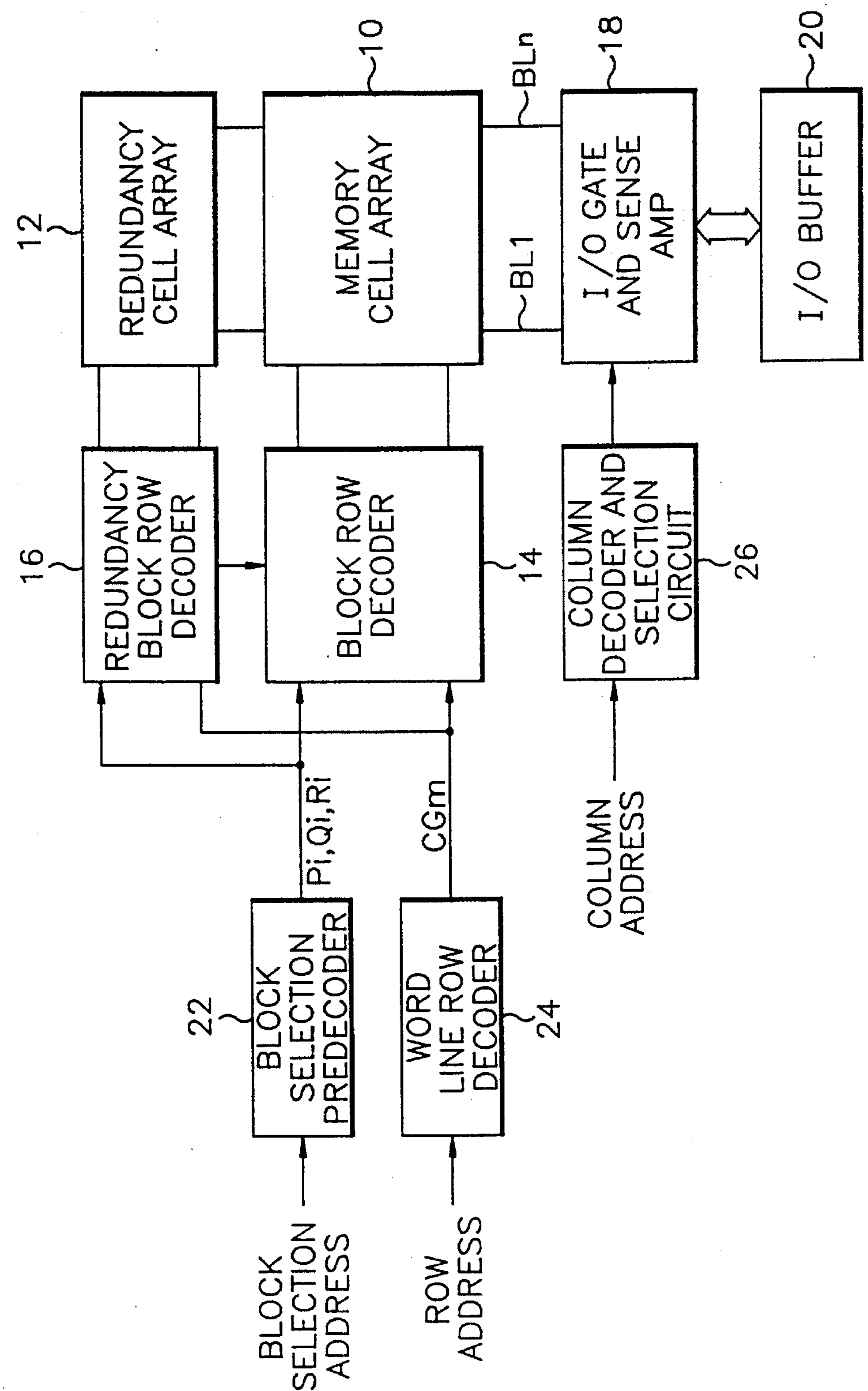
FIG. 1 is a block schematic diagram of an electrically erasable and programmable nonvolatile semiconductor memory device to which the invention is applied.

FIG. 1 shows a schematic block diagram of an electrically erasable and programmable nonvolatile semiconductor memory device to which the invention is applied. Referring to FIG. 1, an EEPROM embodying the invention has a memory cell array 10 composed of main memory cells, and a redundancy cell array 12 composed of defect repairing redundancy cells. The memory cell array 10 includes memory blocks, each composed of a respective plurality of NAND cell strings which are arranged in parallel for sharing word lines and respectively connect to the bit lines BL1 to Bln. Each memory block is selected by a block row decoder 14 and a driving voltage being applied to the word line thereof. The redundancy cell array 12 shares the bit lines with the memory cell array 10, having a predetermined number of memory blocks equal to those in the memory cell array 10. When a defect repairing operation is executed, one memory block in the redundancy cell array 12 replaces the defective memory block of the memory cell array 10 by activating any one of the memory blocks and at the same time isolating an operation of a block row decoder 16. Thus, the memory cell array 10 and the redundancy cell array 12 transfer data to an I/O gate and sense amplifier 18 and an I/O buffer 20 via the bit lines BL1 to BLn. The block selection row decoder 14 and the redundancy block row decoder 16 receive block selection signals Pi, Qi, Ri from a block selection predecoder 22 to select and drive a certain memory block and receive a word line driving signal Cgm from a word line row decoder 24 to drive the word line in the selected memory block. The block selection predecoder 22 receives and decodes a block selection address, to supply the block selection signal Pi, Qi, Ri for selecting a certain memory block. The word line row decoder 24 receives and decodes a row address, to supply the word line driving signal Cgm for driving a certain word line, according to a driving mode—i.e. an erasing mode or a programming mode or a reading mode depending on its respective corresponding voltage level. The I/O gate and sense amplifier 18 is controlled by a column decoder and selection circuit 26, to selectively drive the path through which the bit lines BL1 to BLn and the I/O buffer 20 communicate the sensed and amplified data to each other. The column decoder and selection circuit 26 receives and decodes a column address, to selectively drive the I/O gate.

Figure 2:
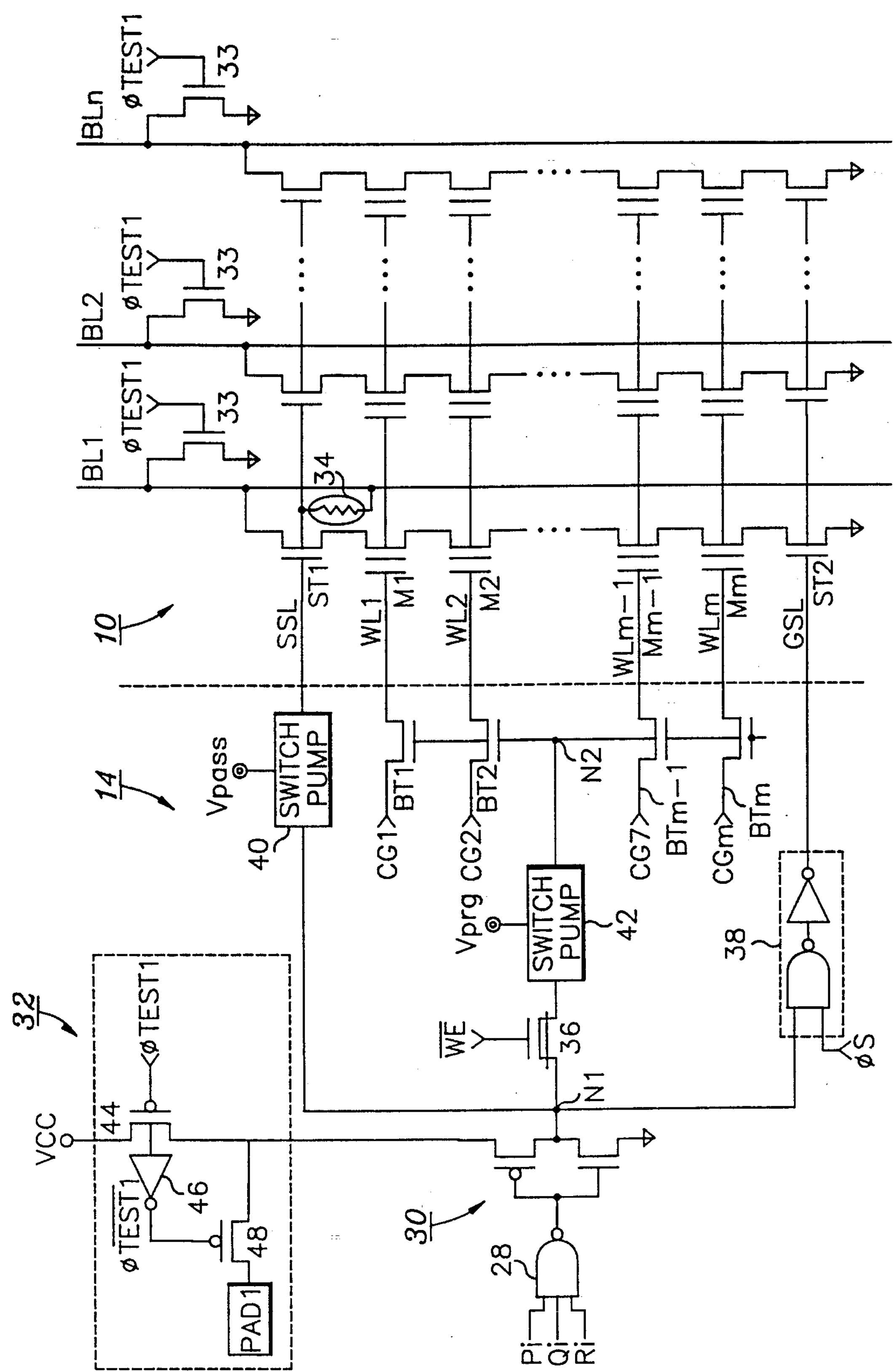
FIG. 2 is a view showing a memory block in a memory cell array and an associated block decoder having circuitry for detecting short-circuited signal lines in accordance with an aspect of the invention.

FIG. 2 illustrates the block row decoder 14 having a circuit for detecting short-circuited signal lines according to the invention and the memory block in the memory cell array 10 corresponding thereto. FIG. 2 is a circuit diagram showing a portion of the block row decoder 14 and of the memory cell array 10 shown in FIG. 1, the circuits shown in FIG. 2 being arranged as the memory blocks.

The FIG. 2 structure includes one memory block of the memory cell array 10, which representative memory block comprises a plurality n in number of NAND cell strings respectively connected to the bit lines BL1 to BLn and sharing the word lines WL1 to WLm, a string selection line SSL and a ground selection line GSL. Each NAND cell string comprises a plurality m in number of memory transistors M1 to Mm with serially connected channels; a string selection transistor ST1, a gate terminal of which connects tom the string selection line SSL, a drain terminal of which connects to the bit line BL1 and a source terminal of which connect to the memory transistor M1; and a ground selection transistor ST2, a gate terminal of which connects to the ground selection lines GSL, a source terminal of which connects to the ground voltage and a drain terminal of which connects to the memory transistor Min. The memory transistor is a typical flash memory cell composed of a control gate for receiving a control signal and a floating gate for accumulating a charge. The word lines WL1 to WLm receive the word line driving signals CG1 to CGm via respective corresponding transfer transistors BT1 to BTM. In addition, the bit lines BL1 to BLn are respectively connected to the test n-channel transistors 33 gate terminals of Which are controlled by a first test control signal ϕTEST1. A resistor 34 connected in dotted line between the string selection line SSL and the bit line BL1, represents a resistance component which occurs when the two lines are short-circuited to each other.

The construction of the block row decoder 14 will now be described. The block selection signals Pi, Qi, Ri supplied from the block selection predecoder 22 are applied to a three-input NAND gate 28; and the NAND gate response to the block selection signals Pi, Qi, Ri is applied to a CMOS inverter 30 as its input signal. The CMOS inverter 30 is typically composed of a p-channel pull-up transistor and an n-channel pull-down transistor, with the p-channel transistor receiving a power supply voltage via a circuit 32 for detecting a short-circuit between signal lines, and with the output node of the CMOS inverter 30 being connected to a control node N1. The control node N1 is connected to a switch pump circuit 40 associated with the string selection line SSL, to a drain terminal of a depletion type isolation transistor 36 and to a ground selector 38 for controlling the enable of the ground selection line GSL. The switch pump circuit 40 is activated in a programming mode, thereby boosting the string selection line SSL to pass voltage Vpass (e.g., 10 volts). The ground selector 38 is means for ANDing the logic level of the control node N1 and the control signal φS, with the control signal φS being applied as a logic low level (i.e., 0 volt) in the erasing mode and programming mode and applied as a logic high level (i.e., the power supply voltage Vcc level) in a reading mode. A source terminal of the depletion type isolation transistor 36 is connected to the switch pump circuit 42 and the output of the switch pump circuit 42 is applied to a control node N2—i.e., to a common connection node of the gate terminals of the transfer transistors BT1 to BTm. The switch pump circuit 42 supplies the voltage of 0 volt in the erasing mode, the voltage boosted to a program voltage Vprg (e.g., 18 volts) in the programming mode and the power supply voltage Vcc in the reading mode, respectively, to the control node N2.

The signal lines short-circuit detecting circuit 32 comprises a p-channel transistor 44, the channel of which connects between the power supply voltage Vcc and the power supply voltage input node of the p-channel transistor of the CMOS inverter 30, and the gate of which is controlled by the first test control signal φTEST1; an inverter 46 for inverting the first test control signal φTEST1; and a p-channel MOS transistor 48, the gate of which receives the φ$\overline{\text{TEST1}}$ output of the inverter 46, and the channel of which connects between the power supply voltage input node of the p-channel transistor of the CMOS inverter 30 and the test pad PAD1.

Figure 3:
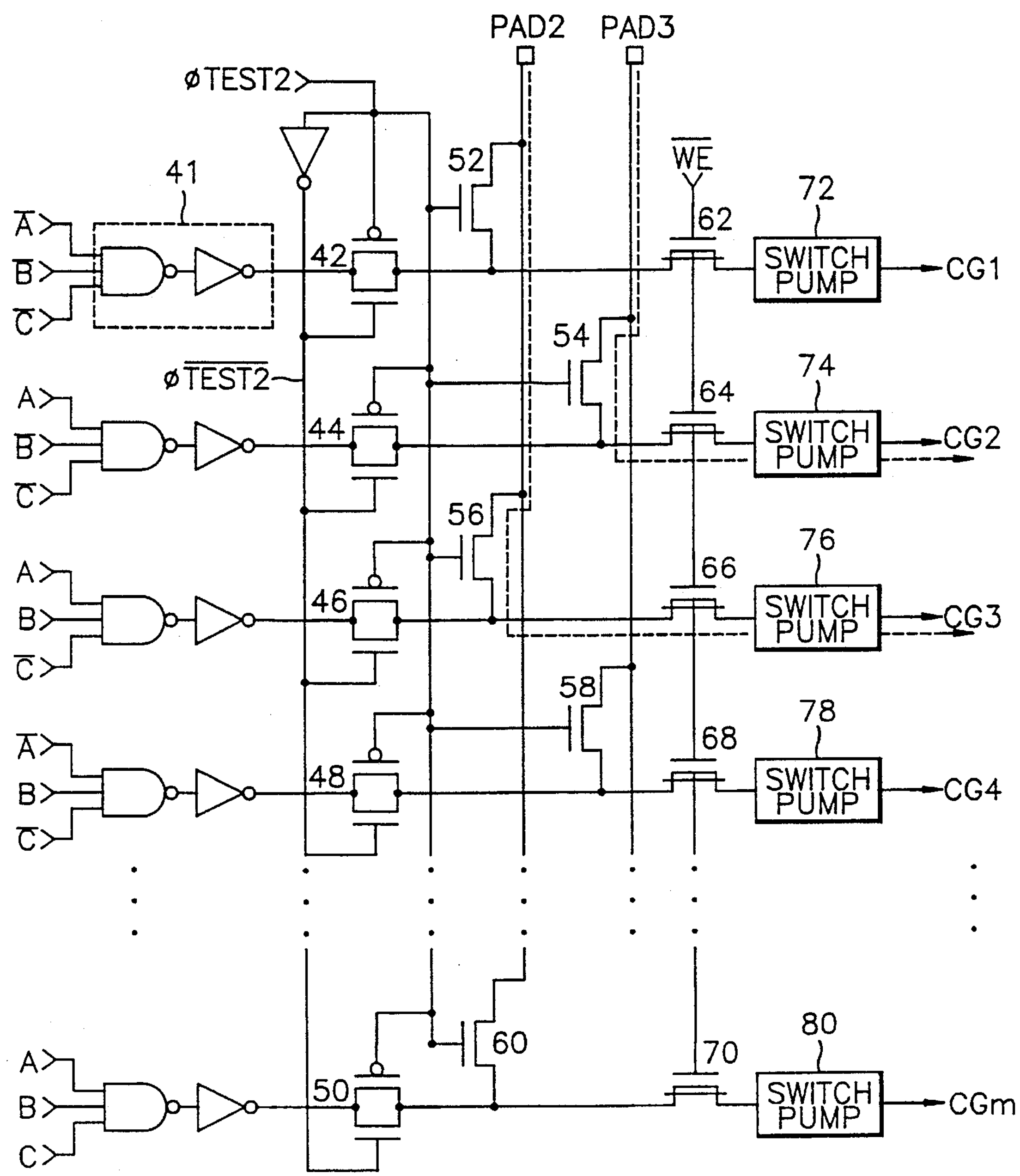
FIG. 3 is a detailed circuit diagram of a word line row decoder having circuitry for detecting short-circuited signal lines in accordance with an aspect of the invention.

FIG. 3 shows a detailed circuit diagram of the word line row decoder 14 including the circuit for detecting short-circuited signal lines embodying an aspect of the invention. Referring to FIG. 3, the decoding signals ($\overline{A}\,\overline{B}\,\overline{C}$, A $\overline{B}\,\overline{C}$, A B $\overline{C}$, $\overline{A}$ B $\overline{C}$, . . . A B C) of the row address signal ABC are respectively applied to the decoders 41, the outputs of which are applied to switch pump circuits 72, 74, 76, 78, and 80 via respective corresponding CMOS transfer gates 42, 44, 46, 48, and 50 and thence the depletion type isolation transistors 62, 64, 66, 68, and 70. The outputs of the switch pump circuits 72, 74, 76, 78, and 80 are respectively applied as the word line driving signals CG1 to CGm to the block row decoder 14 shown in FIG. 2. The switch pump circuits 72, 74, 76, 78, and 80 are operated to supply 0 volt to a selected word line and the power supply voltage Vcc to each unselected word line in the reading mode, 0 volt to all word lines in the erasing mode, and the program voltage Vprg to the selected word line and the pass voltage Vpass to each unselected word line in the programming mode.

The circuit for detecting short-circuited signal lines shown in FIG. 3 is composed of the CMOS transfer gates 42, 44, 46, 48, and 50 and the n-channel transistors 52, 54, 56, 58, and 60 for connecting each word line to the test pads. The CMOS transfer gates 42, 44, 46, 48, and 50 receive the corresponding output of the decoder 41 through the common connected channel, the gates of the p-channel transistors therein being controlled by the second test control signal φTEST2 and the gates of the n-channel transistors therein being controlled by the complemented second test control signal φ$\overline{\text{TEST2}}$. The test pad PAD2 is respectively connected to CG1, CG3, . . . CGm-1 via the channels of corresponding n-channel transistors (52, 56, 60 etc.) while the test pad PAD3 is respectively connected to CG2, CG4, . . . CGm via the channels of corresponding n-channel transistors (54, 58, etc.). Accordingly, PAD2 corresponds to the odd-numbered word lines WL1, WL3, . . . WLm-1 while PAD3 corresponds to the even-numbered word lines WL2, WL4, . . . WLm. The gates of the n-channel transistors 52, 54, 56, 58 and 60 the channels of which connect between word lines and the pads PAD2 and PAD3 are all controlled by the second test control signal φTEST2.

A method for detecting short-circuited signal lines that is an aspect of the invention will now be described with reference to FIGS. 2 and 3 of the drawing. Referring to FIG. 2, when the first test control signal φTEST1 is at a logic low level, the p-channel transistor 44 in the circuit 32 for detecting shorted signal lines is turned on and the n-channel transistors 33 connected to each bit line are all turned off, so the memory device can be operated normally. However, if a first test control signal φTEST1 of a logic high level is applied, the p-channel transistor 44 is turned off and at the same time the p-channel transistor 48 connected to the test pad PAD1 and the n-channel transistors 33 connected to each bit line are all turned on. Accordingly, the source terminal of the p-channel transistor of the CMOS inverter 30 is connected to PAD1 and the bit lines BL1 to BLn are all discharged to the reference potential Supposing the power supply voltage Vcc is applied to the test pad PAD1, the CMOS inverter 30 can perform a normal inverting operation. Accordingly, if the FIG. 2 memory block is selected, namely, if the output of the NAND gate 28 is changed to a logic low level by the block selection signals Pi, Qi, Ri, the string selection line SSL forms the current path with the test pads via the p-channel transistor of the CMOS inverter 30. At this time, if any one of the bit lines BL1 to BLn is short-circuited to the string selection line SSL, current flows from PAD1 to the reference potential via the current path through the channel of the p-channel transistor 48, the channel of the p-channel transistor of the CMOS inverter 30, the channel of a transistor in the switch pump circuit 40 rendered conductive by the application of Vpass to its gate, the string selection line SSL, resistance component 34 associated with the short-circuit to be detected, the bit line BL, and the channel of the n-channel transistor 33. Accordingly, it can be ascertained if the string selection line SSL is short-circuited with the bit lines BL1 to BLn, by applying a voltage to the test pad and then checking if the current flows from the pad.

FIG. 2 illustrates an embodiment of the invention for detecting any short-circuit between the string selection line and the bit line, however, it is possible to apply the same construction as this between the ground selection line and the bit line in alternative embodiments of the invention.

Another embodiment of the present invention will be discussed with reference to FIG. 3. FIG. 3 illustrates an embodiment of detecting any short-circuit between the word lines. The characteristic of the embodiment shown in the figure is that the word lines are floated. Namely, when the second test control signal φTEST2 is at a logic high level, the CMOS transfer gates 42, 44, 46, 48 and 50 connected to the decoders 41 are all turned off. As a result, the word lines WL1 to WLm go to floating states and at the same time the odd-numbered word lines, WL1, WL3, . . . WLm-1 are connected to PAD2 while the even-numbered word lines WL2, WL4, . . . WLm are connected to PAD3. Accordingly, it can be ascertained that if any current path is formed between PAD1 and PAD2 after applying the power supply voltage to either of the two pads and the reference potential to the other, there is a short-circuit between two adjacent word lines. If no such current path is formed, there is no short-circuit between the two adjacent word lines.

FIG. 3 illustrates an embodiment using two test pads, however, it is possible to provide a respective test pad for each word line in alternative embodiments of the invention. Or respective test pads may be provided for different groups of lines. Such test pad arrangements provide for reducing test time by conducting testing in parallel.

In addition, with the combination of the circuits shown in FIG. 2 and FIG. 3 for detecting short-circuits between signal lines, any short-circuit between a respective pair of signal lines—e.g., between two word lines, between a word line and a string selection line, or between a string selection line and a bit line in any of the sequentially activated memory blocks—can be detected. Checks for short-circuits between each pair of adjacent signal lines in a memory block can be sequentially performed, and thereafter another memory block can be selected for similar testing. The testing procedure is completed when checks for short-circuits between each pair of adjacent signal lines in each memory block have been sequentially performed for all of the sequentially selected memory blocks.

As described above, the present invention is advantageous in that any short-circuit between a pair of signal lines can be easily and accurately detected in a faster testing procedure, without appreciably increasing the area of the chip.

What is claimed:

1. An electrically erasable and programmable nonvolatile semiconductor memory device including a ground power-supply line and at least one other power-supply line therein, said semiconductor memory device comprising:

first and second test pads, neither of which during normal memory operation connects to any of said power-supply lines in said semiconductor memory device;

a block selection predecoder for decoding each block selection address supplied thereto, to generate a corresponding block selection signal at a respective output connection of said block selection predecoder;

a word line row decoder for decoding each row address supplied thereto, to generate a corresponding word line driving signal at a respective output connection of said word line row decoder;

a plurality of memory blocks, each composed of a predetermined number of NAND cell strings that receive said word line driving signal in common via shared word lines, a respective one of said memory blocks being selectively activated by each said block selection signal; and circuitry for detecting short-circuited signal lines by respectively floating first and second signal lines disposed in a first of said memory blocks to interrupt connections selectively made from said first and second signal lines during normal operation of said first memory block, so said first and second signal lines float respective to said power-supply lines in said semiconductor memory device unless referred thereto by connection external to said semiconductor memory device, while connecting said first and second signal lines respectively to said first test pad and to said second test pad to implement checking whether a current path between said test pads is formed, thus to detect any short-circuit between said first and second signal lines.

2. An electrically erasable and programmable nonvolatile semiconductor memory device as recited in claim 1, wherein said first and second signal lines are ones of said word lines that are next to each other at points along their respective lengths.

3. An electrically erasable and programmable nonvolatile semiconductor memory device as recited in claim 1, wherein said first and second signal lines are one of said word lines and a NAND cell string selection line that are next to each other at points along their respective lengths.

4. An electrically erasable and programmable nonvolatile semiconductor memory device as recited in claim 1, wherein said first and second signal lines are one of said word lines and a ground selection line that are next to each other at points along their respective lengths.

5. An electrically erasable and programmable nonvolatile semiconductor memory device as recited in claim 1, wherein the first and second signal lines are a bit line and a NAND cell string selection line that are next to each other at points along their respective lengths.

6. A method of detecting short-circuited signal lines in an electrically erasable and programmable nonvolatile semiconductor memory device having a ground power-supply line and at least one other power-supply line therein and having first and second test pads neither of which during normal memory operation connects to any said power-supply line in said semiconductor memory device, said signal lines having connections to respective nodes during normal memory operation, said method comprising the steps of:

supplying a test command;

in response to said test command, floating first and second signal lines respective to said power-supply lines in said semiconductor memory device unless referred thereto by connection external to said semiconductor memory device by disconnecting said first and second signal lines from said respective nodes they connect to during normal memory operation, forming an electrical path between said first signal line and said first test pad, and forming an electrical path between said second signal line and said second test pad; and determining whether a current path is formed between said first and second test pads, for detecting any short-circuit between said first and second signal lines.

7. An electrically erasable and programmable nonvolatile semiconductor memory device including a ground power-supply line and at least one other power-supply line therein, said semiconductor memory device comprising:

a test pad which during normal memory operation connects to none of said power-supply lines in said semiconductor memory device;

a block selection predecoder for decoding each block selection address supplied thereto, to generate a corresponding block selection signal at a respective output connection of said block selection predecoder;

a word line row decoder for decoding each row address supplied thereto, to generate a corresponding word line driving signal at a respective output connection of said word line row decoder;

a plurality of memory blocks, each composed of a predetermined number of NAND cell strings that receive said word line driving signal in common via shared word lines, a respective one of said memory blocks being selectively activated by each said block selection signal; and circuitry for detecting short-circuited signal lines by respectively floating first and second signal lines disposed in a first of said memory blocks to interrupt connections selectively made from said first and second signal lines during normal operation of said first memory block, so said first signal line floats respective to said power-supply lines in said semiconductor memory device except unless referred thereto by connection external to said semiconductor memory device, and then connecting said first signal line to said test pad and discharging said second signal line to a reference potential to implement checking whether a current path from said test pad to said reference potential is formed, thus to detect any short-circuit between said first and second signal lines.

8. An electrically erasable and programmable nonvolatile semiconductor memory device as recited in claim 7, wherein said first and second signal lines are respective ones of said word lines that are next to each other at points along their respective lengths.

9. An electrically erasable and programmable nonvolatile semiconductor memory device as recited in claim 7, wherein said first and second signal lines are a string selection line and one of said word lines that is next to said string selection line at points along their respective lengths.

10. An electrically erasable and programmable nonvolatile semiconductor memory device as recited in claim 7, wherein said first and second signal lines are a ground selection line and one of said word lines that is next to said ground selection line at points along their respective lengths.

11. An electrically erasable and programmable nonvolatile semiconductor memory device as recited in claim 7, wherein said first and second signal lines are a string selection line and a bit line that are next to each other at points along their respective lengths.

12. A method of detecting short-circuited signal lines in an electrically erasable and programmable nonvolatile semiconductor memory device having a ground power-supply line and at least one other power-supply line therein and having a test pad connected during normal memory operation to none of said power-supply lines in said semiconductor memory device, said signal lines having connections to respective nodes during normal memory operation, said method comprising the steps of:

supplying a test command;

in response to said test command, floating first and second signal lines respective to said power-supply line in said semiconductor memory device by disconnecting said first and second signal lines from said respective nodes they connect to during normal memory operation, forming an electrical path between said first signal line and said test pad, and discharging said second signal line to a reference potential; and determining whether a current path is formed from said test pad to said reference potential, while said first signal line floats respective to said power-supply lines in said semiconductor memory device except as referred thereto by connection external to said semiconductor memory device, for detecting any short-circuit between said first and second signal lines.

13. A method of detecting short-circuited signal lines in an electrically erasable and programmable nonvolatile semiconductor memory device having a ground power-supply line and at least one other power-supply line therein and having first and second test pads neither of which during normal memory operation connects to any said power-supply line in said semiconductor memory device, a block selection predecoder for decoding a block selection address supplied to said semiconductor memory device to generate a block selection signal, a word line row decoder for decoding a row address supplied to said semiconductor memory device to generate a word line driving signal, and a plurality of memory blocks each composed of a predetermined number of NAND cell strings receiving said word line driving signal in common via shared word lines, a respective one of said memory blocks being selectively activated by each condition of said block selection signal, said method comprising the steps of:

activating a selected one of said memory blocks by said selection signal;

supplying a test command;

in response to said test command, floating first and second signal lines within the selected one of said memory blocks by disconnecting said first and second signal lines from respective nodes they connect to during normal memory operation, so said first and second signal lines float respective to said power-supply lines in said semiconductor memory device unless referred thereto by connection external to said semiconductor memory device, forming an electrical path between said first signal line and said first test pad, and forming an electrical path between said second signal line and said second test pad;

determining whether a current path is formed between said first and second test pads, for detecting any short-circuit between said first and second signal lines; and changing said block selection signal, to activate another memory block and then repeating the steps of floating and determining.

14. A method of detecting short-circuited word lines in an electrically erasable and programmable nonvolatile semiconductor memory device having a ground power-supply line and at least one other power-supply line therein and having a test pad which during normal memory operation connects to none of said power-supply lines in said semiconductor memory device, a block selection predecoder for decoding a block selection address supplied to said semiconductor memory device to generate a block selection signal, a word line row decoder for decoding a row address supplied to said semiconductor memory device to generate a word line driving signal, and a plurality of memory blocks each composed of a predetermined number of NAND cell strings receiving said word line driving signal in common via shared word lines, a respective one of said memory blocks being selectively activated by each condition of said block selection signal, said method comprising the steps of:

activating a selected one of the memory blocks by said selection signal;

supplying a test command;

in response to said test command, floating first and second signal lines by disconnecting said first and second signal lines from respective nodes they connect to during normal memory operation, and forming an electrical path between said first signal line and said test pad while discharging said second signal line to a reference potential;

determining if a current path is formed from said test pad to said reference potential, while said first signal line floats respective to said power-supply lines in said semiconductor memory device except as referred thereto by connection external to said semiconductor memory device, for detecting any short-circuit between said first and second word lines; and changing said block selection signal, to activate another memory block and then repeating the steps of floating and determining.

15. A method of detecting short-circuits between word lines in an electrically erasable and programmable nonvolatile semiconductor memory device having a ground power-supply line and at least one other power-supply line therein and having first and second test pads neither of which during normal memory operation connects to any said power-supply line in said semiconductor memory device, each of said word lines being selectively connected to a word line row decoder during normal memory operation and being included within one of first and second sets of word lines, said method comprising the steps of:

supplying a test command;

in response to said test command, selectively disconnecting each of said word lines from said word line row decoder, selectively connecting each of said word lines in said first set to said first test pad, and selectively connecting each of said word lines in said second set to said second test pad; and determining whether a current path is formed between said first and second test pads, for detecting any short-circuit between said first and second sets of word lines.

16. A method of detecting short-circuits between a bit line and another signal line in an electrically erasable and programmable nonvolatile semiconductor memory device having a ground power-supply line and at least one other power-supply line therein and having a test pad which during normal memory operation connects to none of said power-supply lines in said semiconductor memory device, said other signal line having a source of driving signal connected thereto during normal memory operation for controlling potential on said other signal line, said method comprising the steps of:

supplying a test command;

in response to said test command, discontinuing the control of the potential of said other signal line by said source of driving signal by disconnecting said other signal line from said source of driving signal, connecting said other signal line to said test pad, and discharging said bit line to a reference potential; and determining whether a current path is formed from said test pad to said reference potential, for detecting any short-circuit between said bit line and said other signal line.

17. A method of detecting short-circuits between any of a plurality of bit lines and another signal line in an electrically erasable and programmable nonvolatile semiconductor memory device having a ground power-supply line and at least one other power-supply line therein and having a test pad which during normal memory operation connects to none of said power-supply lines in said semiconductor memory device, said other signal line having a source of driving signal connected thereto during normal memory operation for controlling potential on said other signal line, said method comprising the steps of:

supplying a test command;

in response to said test command, discontinuing the control of the potential of said other signal line by said source of driving signal by disconnecting said other signal line from said source of driving signal, connecting said other signal line to said test pad, and discharging all of said bit lines to a reference potential; and determining whether a current path is formed from said test pad to said reference potential, for detecting any short-circuit between any said bit line and said other signal line.

18. An electrically erasable and programmable nonvolatile semiconductor memory device including a ground power supply line and at least one other power-supply line therein, said semiconductor memory device comprising:

a block selection predecoder for decoding each of a predetermined first number of block selection addresses to generate a corresponding block selection signal;

a word line row decoder for decoding each of a predetermined second number of row addresses to generate a corresponding word line driving signal at a respective output connection of said word line row decoder;

a plurality of memory blocks of said predetermined first number, each of said memory blocks composed of a predetermined third number of NAND cell strings that have respective bit lines and that share a plurality of word lines of said predetermined second number, a respective one of said memory blocks being selectively activated by each of said block selection signals;

a first test pad and a second test pad, neither of which during normal memory operation connects to any of said power-supply lines in said semiconductor memory device;

a first respective plurality of transfer gates of said predetermined second number associated with each of said memory blocks, for providing selective connections during testing for short-circuits between word lines in said memory block associated therewith, selective connections of a first set of alternate ones of the word lines in said memory block associated therewith being to said first test pad, and selective connections of a second set of alternate ones of the word lines in said memory block associated therewith being to said second test pad; and a second respective plurality of transfer gates of said predetermined second number associated with each of said memory blocks, for selectively connecting to corresponding output connections of said word line row decoder the word lines shared by said NAND cell strings in said memory block associated therewith during its normal memory operation, and for disconnecting those word lines in said memory block associated therewith when removed from normal memory operation, as during testing for short-circuits between ones of those word lines.

19. An electrically erasable and programmable nonvolatile semiconductor memory device as set forth in claim 18, further comprising:

a node for receiving a test potential;

a third respective plurality of transfer gates of said predetermined third number associated with each of said memory blocks, for providing selective connections of the bit lines in said memory block associated therewith to said node for receiving a test potential, said selective connections being made when testing for short-circuits of any of said bit lines in said memory block associated therewith to another signal line in said memory block associated therewith.

20. An electrically erasable and programmable nonvolatile semiconductor memory device as set forth in claim 19, wherein said other signal lines are selection signal lines, said semiconductor memory device further comprising a third test pad which during normal memory operation connects to none of said power-supply lines in said semiconductor memory device; and respective gating circuitry is associated with at least one of said memory blocks for connecting said other signal line therein exclusively to said third test pad when performing said testing for short-circuits to said other signal line.

21. An electrically erasable and programmable nonvolatile semiconductor memory device including a ground power-supply line and at least one other power-supply line therein, said semiconductor memory device comprising:

a block selection predecoder for decoding each of a predetermined first number of block selection addresses to generate a corresponding block selection signal;

a word line row decoder for decoding each of a predetermined second number of row addresses to generate a corresponding word line driving signal at a respective output connection of said word line row decoder;

a plurality of memory blocks of said predetermined first number, each of said memory blocks composed of a predetermined third number of NAND cell strings that have respective bit lines and that share a plurality of word lines of said predetermined second number, a respective one of said memory blocks being selectively activated by each of said block selection signals;

a node for receiving a test potential and a test pad which during normal memory operation connects to none of said power-supply lines in said semiconductor memory device;

a respective plurality of transfer gates of said predetermined third number associated with each of said memory blocks, for providing selective connections of the bit lines in said memory block associated therewith to said node for receiving a test potential, said selective connections being made when testing for short-circuits of any of said bit lines in said memory block associated therewith to another signal line in said memory block associated therewith; and respective gating circuitry associated with at least one of said memory blocks for connecting said other signal line therein exclusively to said test pad when performing said testing.

* * * * *